United States Patent
Cho et al.

(10) Patent No.: US 6,960,515 B2
(45) Date of Patent: Nov. 1, 2005

(54) METHOD OF FORMING A METAL GATE

(75) Inventors: Mahn-Ho Cho, Seoul (KR); Ja-Hum Ku, Sungnam-shi (KR); Chul-Joon Choi, Koyang-shi (KR); Jun-Kyu Cho, Kwangju (KR); Seong-Jun Heo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 10/011,843

(22) Filed: Dec. 4, 2001

(65) Prior Publication Data

US 2002/0127888 A1 Sep. 12, 2002

(30) Foreign Application Priority Data

Mar. 12, 2001 (KR) ........................................ 2001-12600

(51) Int. Cl.⁷ ..................... H01L 21/3205; H01L 21/31; H01L 21/8234
(52) U.S. Cl. ...................... 438/592; 438/585; 438/197; 438/765
(58) Field of Search ................................ 438/592, 585, 438/765, 197, 652, 653, 657, 632

(56) References Cited

U.S. PATENT DOCUMENTS

| 5,132,756 | A | * | 7/1992 | Matsuda ..................... 357/23.1 |
| 5,342,798 | A | * | 8/1994 | Huang ............... 148/DIG. 117 |
| 5,854,096 | A | * | 12/1998 | Ohtani et al. ................ 438/166 |
| 5,962,904 | A | * | 10/1999 | Hu .............................. 257/412 |
| 6,096,640 | A | * | 8/2000 | Hu .............................. 438/652 |
| 6,265,297 | B1 | * | 7/2001 | Powell ........................ 438/197 |
| 6,326,248 | B1 | * | 12/2001 | Ohtani et al. ................ 438/151 |
| 6,348,380 | B1 | * | 2/2002 | Weimer et al. ............. 438/257 |

FOREIGN PATENT DOCUMENTS

| JP | 0636248 | * 11/1994 |
| JP | 3242228 | * 12/2001 |

* cited by examiner

Primary Examiner—Wael Fahmy
Assistant Examiner—Shrinivas H. Rao
(74) Attorney, Agent, or Firm—Mills & Onello LLP

(57) ABSTRACT

In a method of forming a metal gate electrode, an annealing process is performed in a hydrogen-containing gas ambient following a selective oxidation process. During the annealing process, a metal oxide layer formed by the selective oxidation process is removed by a reduction reaction or hydrogen atoms are contained in the metal oxide layer to suppress whisker nucleation and surface mobility.

14 Claims, 5 Drawing Sheets

24

METHOD OF FORMING A METAL GATE

This application relies for priority upon Korean Patent Application No. 2001-12600, filed on Mar. 12, 2001, the contents of which are herein incorporated by reference in their entirety.

FIELD OF THE INVENTION

The present invention relates to a method of manufacturing a semiconductor device and, more particularly, to a method of forming a metal gate.

BACKGROUND OF THE INVENTION

In a semiconductor fabrication process, a gate electrode of a MOS transistor is formed by etching a conductive layer that is formed on a semiconductor substrate to a predetermined thickness. Conventionally, polysilicon is used as a gate electrode material. This is because the polysilicon has excellent interfacial characteristics with respect to a gate oxide layer at high temperatures. As the integration level of semiconductor devices increases, the conventional polysilicon gate electrode fails to meet a suitable operation speed and an adequate sheet resistance for the gate electrode. Therefore, a metal gate electrode that is formed by stacking a high melting point metal (e.g., tungsten) on the polysilicon has recently been proposed. Unfortunately, the tungsten is easily oxidized, which results in abnormal oxidation that causes various problems.

With reference to FIGS. 1A–1B and FIGS. 2A–2B, a conventional method of forming a metal gate is illustrated. Referring now to FIG. 1, a gate oxide layer 12 is formed on a semiconductor substrate 10. A polysilicon layer 14, a tungsten layer 16, and a gate capping layer 18 are sequentially formed on the gate oxide layer 12. Although not shown in the drawings, a conductive barrier layer for preventing the polysilicon layer 14 from reacting with the tungsten layer 16 is further formed therebetween. The stacked layers 14, 16, and 18 are etched to form a metal gate electrode pattern 20. Conventionally, an oxidation process is then performed in order to cure an etch-damage (reference number 22) and thereby secure the reliability of the gate oxide layer 12. At this time, a thin oxide layer 12a is formed on a sidewall of the silicon layer 14. Since the oxidation speed of tungsten is far greater than that of silicon, abnormal oxidation (12b) occurs, as shown in FIG. 1B. In this case, a spacer is incompletely formed at the portion of the abnormal oxidation during a subsequent process of forming a sidewall spacer. This results in oxidation therethrough during a subsequent annealing process or creation of a whisker during deposition of a spacer silicon nitride layer.

In order to prevent such abnormal oxidation at the metal gate electrode, a selective oxidation process is widely used. The selective oxidation generally means that after etching a gate, only silicon is oxidized while metal is not oxidized so as to secure the reliability of a gate oxide layer and cure any etch-damage. The selective oxidation is performed to control oxygen and hydrogen gases. Accordingly, $H_2O$ and $H_2$ partial pressure is controlled to oxidize silicon selectively.

In a selective oxidation such as wet hydrogen oxidation, the following chemical reaction is controlled to oxidize only silicon.

Reaction Equation

With proper control of $H_2O$ and $H_2$ partial pressure, the equilibrium for the first reaction is favored towards the right part of the reaction equation, while the second equilibrium prefers to go to the left. This makes it possible to prevent tungsten oxidation.

However, it is very difficult to control the $H_2O$ and $H_2$ partial pressures so as to oxidize only silicon. Accordingly, tungsten is therefore oxidized somewhat, as shown in FIG. 2A. The tungsten oxide layer 12c causes a whisker 24 due to thermal energy in various subsequent annealing steps of the semiconductor fabrication process, as shown in FIG. 2B. The whisker 24 can result in electric short between adjacent gate electrodes.

The whisker 24 is created by an amorphous-phase surface of the tungsten oxide layer 12c and nucleation causing a whisker. Accordingly, surface mobility of the tungsten oxide layer 12c is increased, and is moved to a nucleation position to be crystallized. By repetition of such a procedure, a whisker is created.

SUMMARY OF THE INVENTION

The present invention is aimed at addressing the limitations of the conventional approaches. Following a selective oxidation process, an etch-damage of a tungsten oxide layer is cured to suppress nucleation and surface mobility. As a result, whisker creation is prevented to form a reliable metal gate electrode.

In the present invention, an annealing process for preventing a whisker is carried out following a selective oxidation process that is performed after etching a gate. The annealing process suppresses surface mobility of a metal oxide layer that is formed by the selective oxidation process, and thereby prevents whisker nucleation. In the annealing process, the metal oxide layer is partially removed by a reduction reaction that is made by exposure to hydrogen atoms.

More specifically, the annealing process is carried out in an ambient of hydrogen-containing gas that is one of selected from a group consisting of hydrogen, ammonia, and combination gas thereof. The hydrogen-containing gas penetrates the metal oxide layer, thereby curing a layer defect that provides a nucleation space. Also, the hydrogen-containing gas stays at the space, thereby serving as a mechanical barrier that suppresses layer surface movement.

In the preferred embodiment, nitrogen gas or argon gas is added so as to enhance uniformity of the annealing process.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

A new and improved method of forming a metal gate will now be described more fully with reference to attached drawings. The description of conventional processing steps (e.g., device isolation, well formation, and ion implantation) will not be repeated in the present discussion.

Figure 1A:
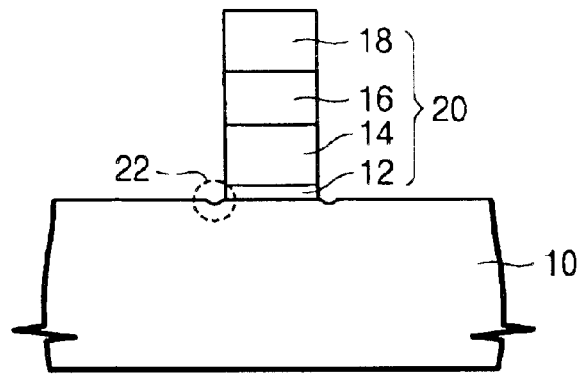
FIGS. 1A–1B are cross-sectional views of a semiconductor substrate, for explaining problems based on a first conventional method of forming a metal gate.
Figure 1B:
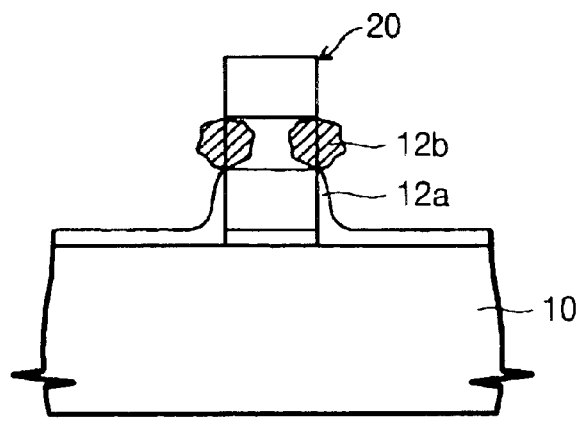
Figure 2A:
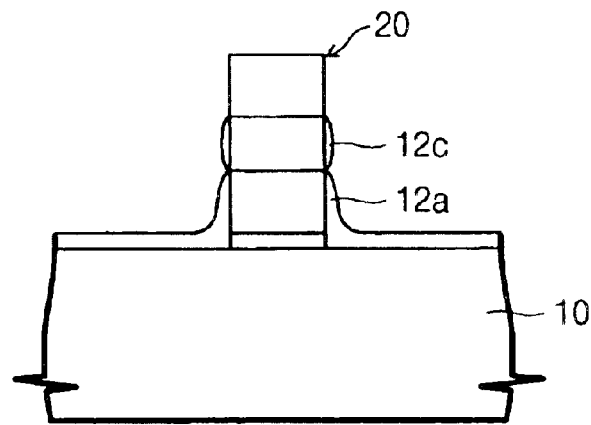
FIGS. 2A–2B are cross-sectional views of a semiconductor substrate, for explaining problems based on a second conventional method of forming a metal gate.
Figure 2B:
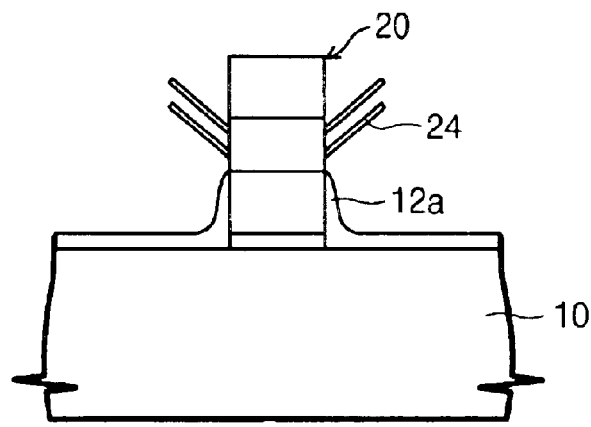
Figure 3A:
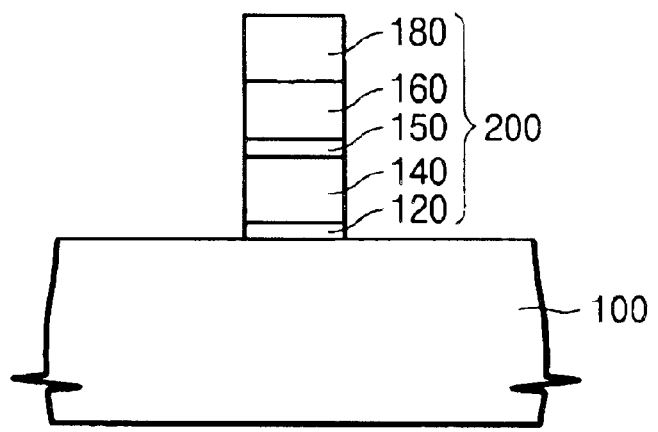
FIGS. 3A–3B are cross-sectional views of a semiconductor substrate, for explaining a method of forming a metal gate according to the present invention.

Referring now to FIG. 3A, a gate insulating layer 120 is formed on a semiconductor substrate 100 using a conventional technique such as thermal oxidation or chemical vapor deposition (CVD). A polysilicon layer 140, a barrier metal layer 150, a metal layer 160, and a gate capping layer 180 are sequentially formed as gate electrode materials. The barrier metal layer 150, the metal layer 160, and the gate capping layer 180 may comprise, for example, tungsten nitride, tungsten, and silicon nitride, respectively. The barrier metal layer 150 prevents the polysilicon layer 140 from reacting with the metal layer 160. The metal layer 160 may be made of a high melting point metal such as tungsten, and the barrier metal layer 150 may be made of titanium nitride.

The stacked layers 180, 160, 150, 140, and 120 are etched through a photo-etch process to form a gate pattern 200. A thermal oxidation process is then performed in order to cure a damage made from a the etch process for forming a gate pattern 200 and secure a reliability of a gate oxide layer. The silicon is subject to a selective oxidation process that an oxide layer is formed on an exposed surface of a semiconductor substrate, while the metal layer 160 is minimally oxidized.

Figure 3B:
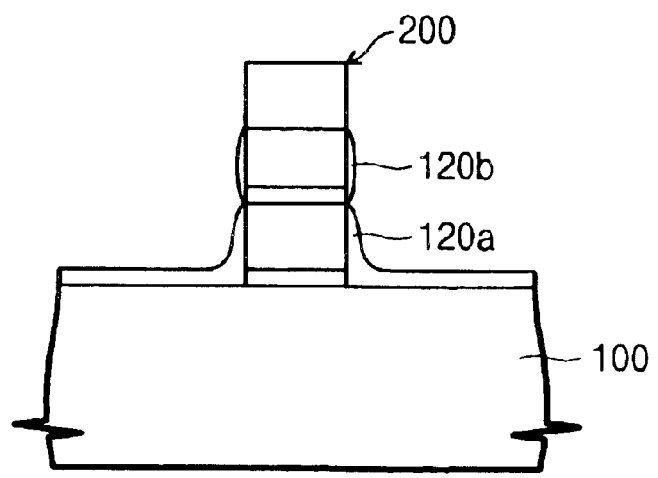

Referring to FIG. 3B, since the selective oxidation process is incomplete, a thin metal oxide layer 120b is formed on a sidewall of the metal layer 160 while a silicon oxide layer 120a is formed on a sidewall of the polysilicon layer 140.

In this regard, a whisker-preventing annealing process is performed in order to prevent the metal oxide layer 120b from creating a whisker in subsequent annealing steps. Requirement for preventing a whisker is that a whisker nucleation and surface mobility of a metal oxide layer are suppressed. Alternatively, the metal oxide layer 120b is deoxidized to be removed.

In order to achieve this, a whisker-preventing annealing process is performed using a hydrogen-containing gas that is one selected from a group consisting of a hydrogen gas, an ammonia gas, and a combination gas thereof. The gas penetrates the metal oxide layer 120b, thereby curing a layer defect that provides a nucleation space. Also, the gas stays in the metal oxide layer 120b, thereby serving as a mechanical barrier that suppresses layer surface movement. As a result, whisker creation is suppressed in a subsequent annealing process.

More preferably, an inert gas such as nitrogen or argon gas is added so as to enable the hydrogen-containing gas to penetrate into the layer. The annealing process is performed at a temperature range of 1000 to 1200° C.

Effects of the present invention will be described with reference to FIG. 4 and FIG. 5. In the test, a metal gate electrode is made by stacking polysilicon, tungsten nitride, and tungsten.

Figure 4A:
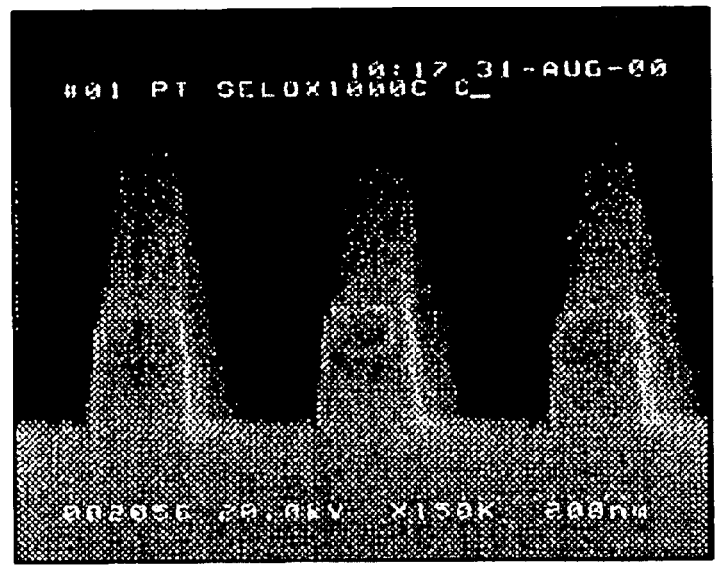
FIG. 4A is a scanning electroscopic micrograph (SEM) of a semiconductor substrate following a selective oxidation process after formation of a gate pattern according to the conventional approach.
Figure 5A:
FIG. 5A is an SEM of a semiconductor substrate shown in FIG. 4A after the semiconductor substrate is annealed.

Referring now to FIG. 4A, according to the conventional approach, a selective oxidation process was performed at a temperature of 1000° C. after formation of a gate pattern, and then an annealing process was performed in oxygen ambient. As a result, a whisker was created at a tungsten oxide layer to form an electric bridge 24 between adjacent gate patterns, as shown in FIG. 5A.

Figure 4B:
FIG. 4B is an SEM of a semiconductor substrate following a selective oxidation process after formation of a gate pattern according to the present invention.
Figure 5B:
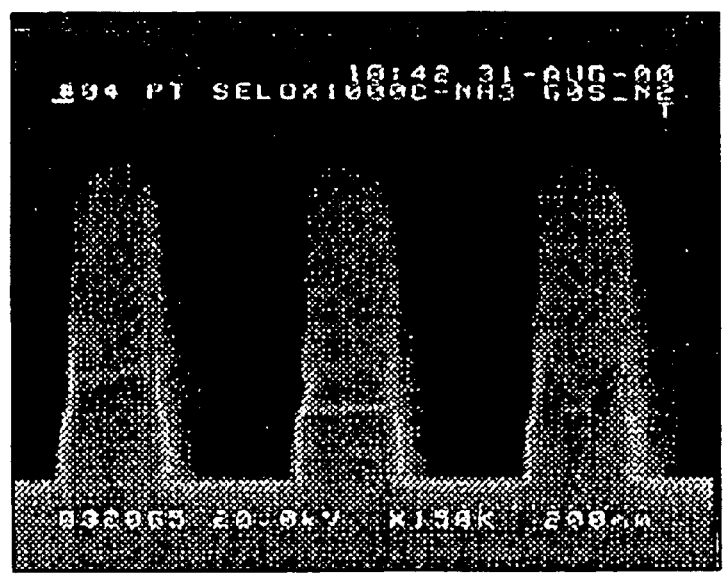
FIG. 5B is an SEM of a semiconductor substrate shown in FIG. 4B after the semiconductor substrate is annealed.

Referring now to FIG. 4B, according to the present invention, a selective oxidation was performed at a temperature of 1000° C. after formation of a gate pattern, and then a whisker-preventing annealing process was performed in ammonia ambient for 60 minutes. Thereafter, another annealing process, which is a thermal process for verifying whether the whisker is generated or not, was performed in nitrogen ambient for 60 minutes. As a result, a whisker was not created at a tungsten layer, as shown in FIG. 5B.

As explained above, after a selective oxidation process, an annealing process is performed in hydrogen-containing gas ambient. Thus, hydrogen atoms penetrate into a metal oxide layer to suppress whisker nucleation or surface mobility of the metal oxide layer. This makes it possible to prevent the metal oxide layer from forming a whisker in a metal gate process.

While the present invention has been particularly shown and described with reference to the preferred embodiments and the experiment thereof, it will be understood by those skilled in the art that various changes in form and details may be made without departing from the spirit and scope of the present invention.

What is claimed is:

1. A method of manufacturing a semiconductor device comprising a semiconductor substrate having sequentially provided thereon at least the following stacked layers: a silicon layer, a conductive barrier layer, and a metal layer, the method comprising the sequential, ordered steps of:

(a) etching the stacked layers to form a gate pattern;
   (b) subjecting the gate pattern and exposed sidewalls of the metal layer to selective oxidation conditions effective to selectively oxidize silicon to cure an etch damage while limiting the formation of a metal oxide coating along exposed sidewalls of the metal layer; and,
   (c) following completion of the selective oxidation in step (b), subjecting the metal gate pattern to annealing process (conditions without oxidation) carried out in an ambient of gas consisting essentially of a gas selected from the group consisting of hydrogen, a hydrogen-containing compound, and mixtures thereof, effective to at least partially remove by a reduction reaction the metal oxide coating along the sidewalls of the metal layer and/or to serve as a mechanical barrier that suppresses layer surface movement thereby preventing whisker nucleation.

2. The method of claim 1, wherein the gas is a hydrogen gas, an ammonia gas, or a combination gas, thereof, and the annealing step (c) is performed using at least one of the gases.

3. The method of claim 1, wherein (a) the annealing step (c) is effective to suppress (es) whisker nucleation and surface mobility of a metal oxide coating formed along the exposed sidewalls of the metal layer by the selective oxidation step (b) and to prevent whisker creation (in) during a subsequent thermal process.

4. The method of claim 2, wherein (a) the annealing step (c) is effective to suppress (es) whisker nucleation and surface mobility of (a) the metal oxide coating formed along a the exposed sidewalls of the metal layer by the selective oxidation step (b) and to prevent whisker creation during subsequent thermal process.

5. The method of claim 1, wherein during the annealing step(c), the metal oxide coating formed on exposed sidewalls of the metal layer as a result of the selective oxidation step (b) is at least partially removed by a reduction reaction.

6. The method of claim 2, wherein during the annealing step (c), the metal oxide coating formed on exposed sidewalls of-the metal layer as a result of the selective oxidation step (b) is at least partially removed by a reduction reaction.

7. The method of claim 1, wherein the gas used in annealing step (c) further includes nitrogen gas or argon gas.

8. The method of claim 2, wherein the gas used in annealing step (c) further includes nitrogen gas or argon gas.

9. A method of forming a metal gate pattern on a semiconductor substrate comprising the sequential, ordered steps of:

(a) sequentially stacking at least a silicon layer, a tungsten nitride layer, and a tungsten layer on a silicon semiconductor substrate;

(b) patterning the stacked layers to form a metal gate pattern;

(c) performing selective oxidation on the silicon layer and on the exposed sidewalls of the tungsten layer of the metal gate pattern effective to selectively oxidize silicon to cure an etch damage while limiting the formation of a tungsten oxide coating along the exposed sidewalls of the tungsten layer; and, (d) following completion of the selective oxidation step (c), annealing the metal gate pattern under an ambient of gas consisting essentially of a gas selected from the group consisting of hydrogen, a hydrogen-containg compound, and mixtures thereof, effective to at least partially remove by a reduction reaction the metal oxide coating along the sidewalls of the metal layer and/or to serve as a mechanical barrier that suppresses layer surface movement, thereby preventing whisker nucleation.

10. The method of claim 9, wherein the gas is a hydrogen gas, an ammonia gas, or a combination gas thereof, and the annealing step (d) is performed using at least one of the gases.

11. The method of claim 9, wherein the gas used in annealing step (d) further includes nitrogen gas or argon gas.

12. The method of claim 10, wherein the gas used in annealing step (d) further includes nitrogen gas or argon gas.

13. The method of claim 9, wherein during the annealing step (d), the tungsten oxide coating formed on the exposed sidewalls of the tungsten metal layer as a result of the selective oxidation step (c) is at least partially removed by a reduction reaction.

14. The method of claim 9, wherein annealing step (d) is effective to suppresses whisker nucleation and surface mobility of the tungsten oxide coating formed along the exposed sidewalls of the tungsten layer as a result of the selective oxidation step (c) and to prevent whisker creation in during a subsequent thermal process.

* * * * *